United States Patent
Chen et al.

(10) Patent No.: US 9,142,450 B2
(45) Date of Patent: Sep. 22, 2015

(54) INTERCONNECT STRUCTURE AND METHOD OF FORMING THE SAME

(71) Applicant: Taiwan Semiconductor Manufacturing Company, Ltd., Hsin-Chu (TW)

(72) Inventors: Jeng-Shiou Chen, Kaohsiung (TW); Chih-Yuan Ting, Taipei (TW); Jyu-Horng Shieh, Hsin-Chu (TW); Minghsing Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/791,297

(22) Filed: Mar. 8, 2013

(65) Prior Publication Data

US 2014/0252648 A1   Sep. 11, 2014

(51) Int. Cl.
*H01L 21/4763* (2006.01)
*H01L 21/768* (2006.01)
*H01L 23/532* (2006.01)
*H01L 23/528* (2006.01)
*H01L 21/311* (2006.01)

(52) U.S. Cl.
CPC .... *H01L 21/76835* (2013.01); *H01L 21/31116* (2013.01); *H01L 21/76831* (2013.01); *H01L 21/76837* (2013.01); *H01L 23/5283* (2013.01); *H01L 23/53295* (2013.01); *H01L 21/76826* (2013.01); *H01L 21/76885* (2013.01); *H01L 23/53223* (2013.01); *H01L 23/53238* (2013.01); *H01L 23/53252* (2013.01)

(58) Field of Classification Search
USPC .......................................................... 438/624
See application file for complete search history.

(56) References Cited

U.S. PATENT DOCUMENTS

| | | | | |
|---|---|---|---|---|
| 8,043,972 B1* | 10/2011 | Liu et al. | ........................ | 438/723 |
| 8,470,685 B2* | 6/2013 | Torres et al. | .................... | 438/421 |
| 2010/0133648 A1* | 6/2010 | Seidel et al. | .................. | 257/522 |
| 2010/0219534 A1* | 9/2010 | Seidel et al. | .................. | 257/773 |

* cited by examiner

*Primary Examiner* — Asok K Sarkar
(74) *Attorney, Agent, or Firm* — Slater & Matsil, L.L.P.

(57) ABSTRACT

An interconnect structure and a method of forming an interconnect structure are disclosed. The interconnect structure includes a first metal line and a second metal line over a substrate; a portion of a first low-k (LK) dielectric layer between the first metal line and the second metal line; and a second LK dielectric layer over the portion of the first LK dielectric layer. A top surface of the second LK dielectric layer is substantially coplanar with a top surface of the first metal line or the second metal line, and a thickness of the second LK dielectric layer is less than a thickness of the first metal line or a thickness of the second metal line.

20 Claims, 12 Drawing Sheets

INTERCONNECT STRUCTURE AND METHOD OF FORMING THE SAME

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

As the size of a semiconductor device size decreases, the capacitive coupling between the metal interconnect layers of the BEOL tends to increase since the capacitive coupling is inversely proportional to the distance between the metal interconnect layers. This coupling may ultimately limit the speed of the chip or otherwise inhibit proper chip operation if steps are not taken to reduce the capacitive coupling. Accordingly, a need has developed in the art for an improved method of forming an interconnect structure for an integrated chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
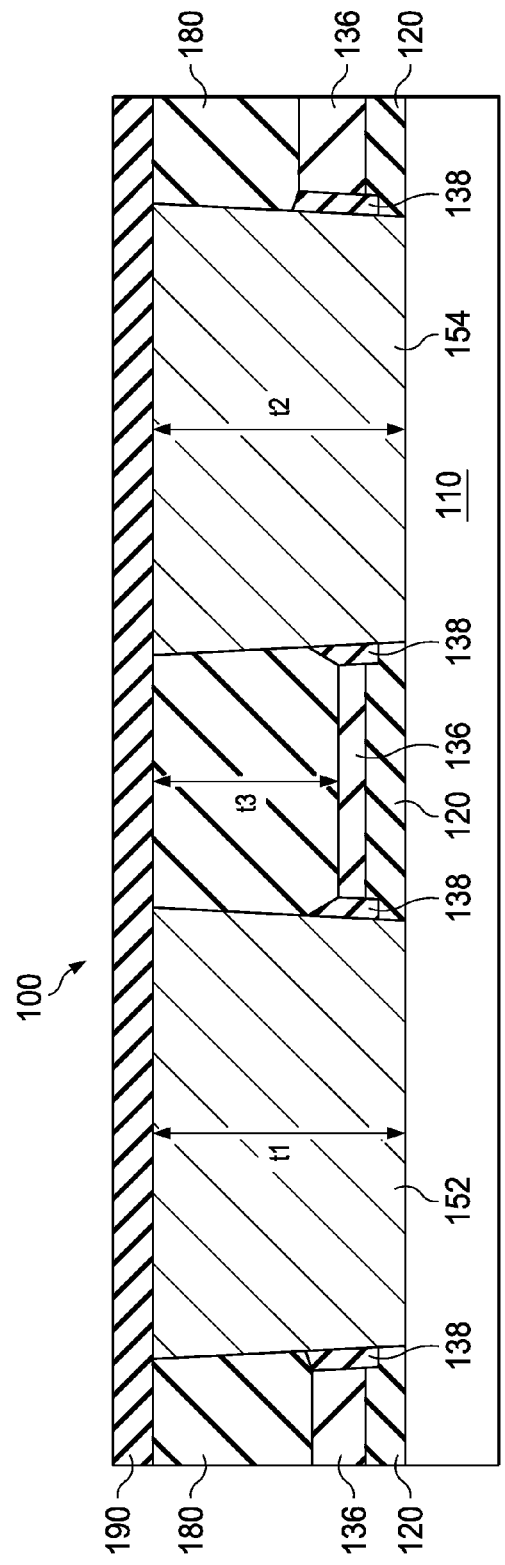
FIG. 1 is a cross-sectional view of an interconnect structure 100 according to various aspects of the present disclosure.

The present disclosure relates generally to semiconductor structures, and more particularly, to methods of forming an interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

There is a need for new methods that provide low RC time constants for advanced semiconductor devices, wherein "R" is the resistance of the on-chip wiring and "C" is the effective capacitance between the signal lines and the surrounding conductors in the multilevel interconnection stack. RC time constants are reduced by lowering the specific resistance of the wiring material, and by using dielectrics with lower dielectric constants, k. Traditional semiconductor fabrication commonly employs silicon dioxide ($SiO_2$) as a dielectric, which has a k of approximately 3.9. Implementation of organic materials or air gaps to reduce k also reduces the overall BEOL capacitance. However, some factors such as plasma damage on the dielectric might increase RC time constants.

FIG. 1 is a cross-sectional view of an interconnect structure 100 according to various aspects of the present disclosure. As depicted in FIG. 1, the interconnect structure 100 comprises a first metal line 152 and a second metal line 154 over a substrate 110; a portion of a first low-k (LK) dielectric layer 136 between the first metal line 152 and the second metal line 154; and a second LK dielectric layer 180 over the portion of the first LK dielectric layer 136, wherein a top surface of the second LK dielectric layer 180 is substantially coplanar with a top surface of the first metal line 152 or the second metal line 154, and wherein a thickness t3 of the second LK dielectric layer 180 is less than a thickness t1 of the first metal line 152 or a thickness t2 of the second metal line 154. The interconnect structure 100 may further comprise a lower etch stop layer (ESL) 120 between the first LK dielectric layer 136 and the substrate 110. The interconnect structure 100 may further comprise an upper ESL 190 over the second LK dielectric layer 180, the first metal line 152, and the second metal line 154. (a layer 138 will be described later on.)

The substrate 110 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate 110 may be a semiconductor on insulator (SOI). In some examples, the substrate 110 may include a doped epilayer. In other examples, the silicon substrate may include a multilayer compound semiconductor structure. Alternatively, the first substrate may include a non-semiconductor material, such as a glass, fused quartz, or calcium fluoride. In the present example, the substrate 110 includes a silicon wafer. In yet another example, the substrate 110 may also include a dielectric layer, a conducting layer (such as a gate electrode or a metal line), or combinations thereof.

A dielectric material of the first LK dielectric layer 136 or the second LK dielectric layer 180 comprises an oxide, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. In some embodiments, the k value of the second LK dielectric layer 180 is less than or substantially equal to that of the first LK dielectric layer 136. In some embodiments, the thickness t3 of the second LK dielectric layer 180 is about 1 nm to about 50 nm. The first LK dielectric layer 136 or the second LK dielectric layer 180 may be formed by atomic layer deposition (ALD), chemical vapor deposition (CVD), physical vapor deposition (PVD), or combinations thereof.

The first metal line 152 or the second metal line 154 comprises copper (Cu), aluminum (Al), silver (Ag), gold (Au), or alloys thereof. The first metal line 152 or the second metal line 154 may also comprise one or more barrier layers selected from a group of W, WN, Ti, Al, TiAl, TiN, TiAlN, Ta, TaC, TaN, TaCN, TaSiN, Mn, Zr, Nb, or Ru. The first metal line 152 or the second metal line 154 may be formed by a process including, but not limited to, ALD, CVD, PVD, sputtering, plating, or combinations thereof. A planarization process, such as a chemical-mechanical planarization/polishing (CMP) process, may be performed to planarize at least one of the second LK dielectric layer 180, the first metal line 152, or the second metal line 154.

The material for the lower ESL 120 or the upper ESL 190 includes SiO, SiC, SiN, SiOC, SiON, SiCN, TiN, AlN, AlON, TEOS, hard black diamond (HBD), or the like. Alternatively, the lower ESL 120 or the upper ESL 190 may be formed by depositing and annealing a metal oxide material, which includes hafnium (Hf), hafnium oxide ($HfO_2$), or aluminum (Al). In some embodiments, the lower ESL 120 or the upper ESL 190 has a thickness in a range from about 10 angstroms (Å) to about 300 angstroms (Å). The lower ESL 120 or the upper ESL 190 may be formed using a suitable process such as ALD, CVD, PVD, molecular beam epitaxy (MBE), spin-on, or combinations thereof.

The interconnect structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2:
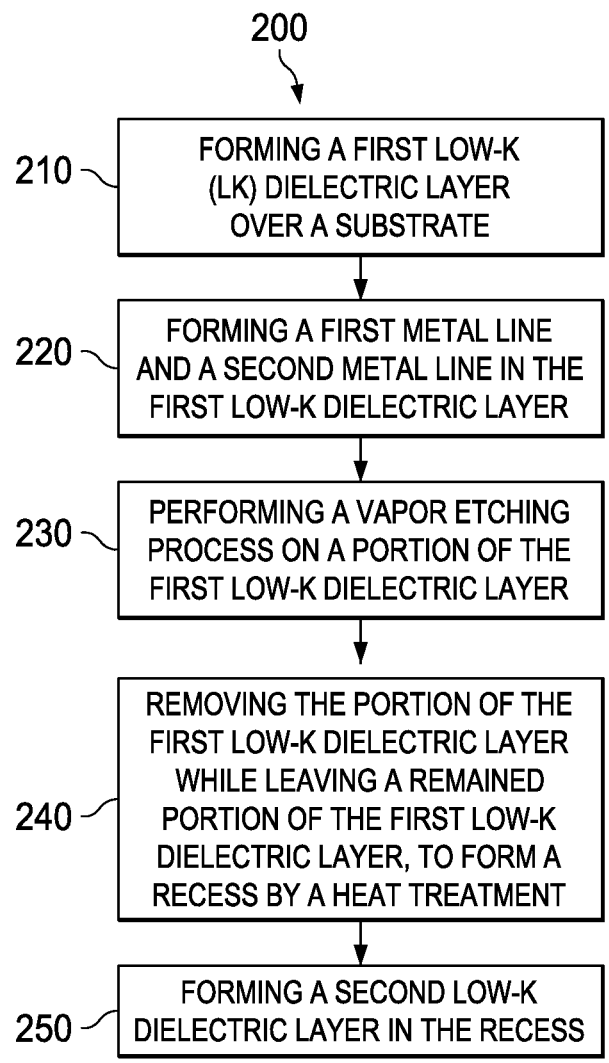
FIG. 2 is a flowchart of a method 200 of forming an interconnect structure 100 according to various aspects of the present disclosure.

FIG. 2 is a flowchart of a method 200 of forming an interconnect structure 100 according to various aspects of the present disclosure. It is understood that additional steps can be provided before, during, and after the method 200, and some of the steps described can be replaced or eliminated for other embodiments of the method 200. The method 200 begins at step 210 in which a first low-k (LK) dielectric layer is formed over a substrate. The method 200 continues with step 220 in which a first metal line and a second metal line are formed in the first LK dielectric layer. The method 200 continues with step 230 in which a vapor etching process is performed on a portion of the first LK dielectric layer. The method 200 continues with step 240 in which the portion of the first LK dielectric layer is removed while a remained portion of the first LK dielectric layer is left to form a recess by a heat treatment. The method 200 continues with step 250 in which a second LK dielectric layer is formed in the recess. The method 200 may further comprise forming a lower etch stop layer (ESL) over the substrate before the forming the first LK dielectric layer over the substrate. The method 200 may further comprise forming an upper etch stop layer (ESL) over the second LK dielectric layer, the first metal line, and the second metal line. The discussion that follows illustrates embodiments of the interconnect structure 100 that can be fabricated according to the method 200 of FIG. 2.

Figure 3:
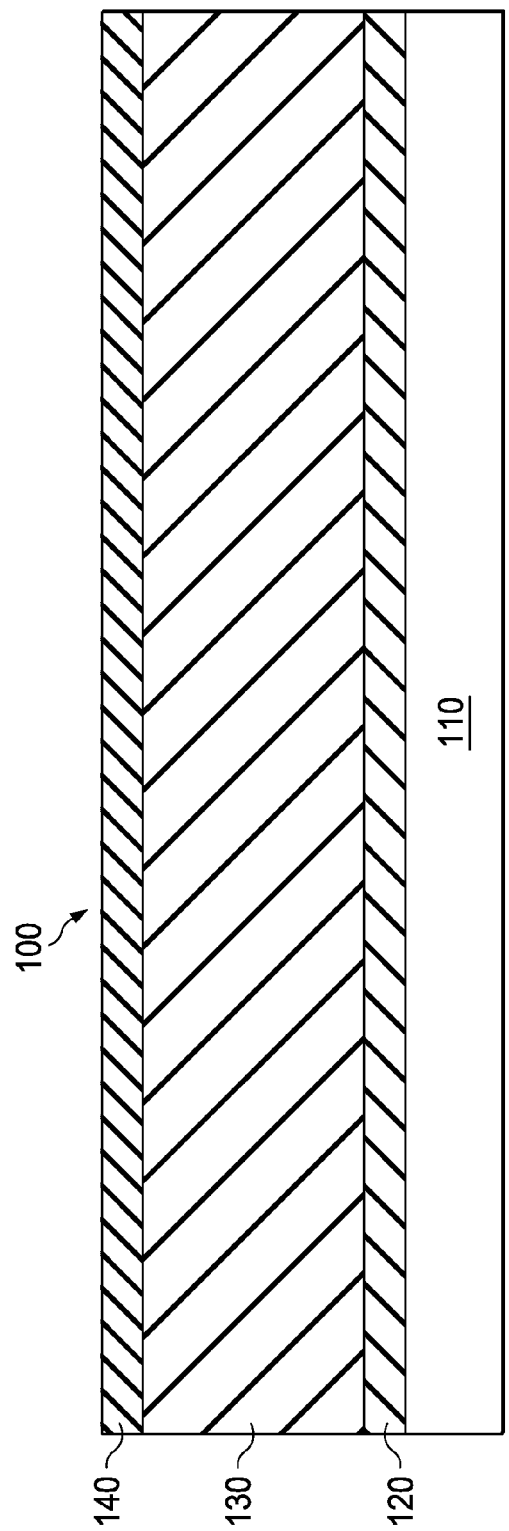
FIGS. 3-11 are cross-sectional views of the interconnect structure 100 at various stages of fabrication according to various aspects of the present disclosure.

FIGS. 3-11 are cross-sectional views of the interconnect structure 100 at various stages of fabrication according to various aspects of the present disclosure. As depicted in FIG. 3 and step 210 in FIG. 2, the method 200 begins at step 210 by forming a first low-k (LK) dielectric layer 130 over a substrate 110. The first LK dielectric layer 130 may be formed by ALD, CVD, PVD, or combinations thereof. A dielectric material of the first LK dielectric layer 130 comprises an oxide, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8.

As depicted in FIG. 3, the method 200 may further comprise forming a lower etch stop layer (ESL) 120 over the substrate 110 before the forming the first LK dielectric layer 130 over the substrate 110. The lower ESL 120 may be formed using a suitable process such as ALD, CVD, PVD, MBE, spin-on, or combinations thereof. The material for the lower ESL 120 includes SiO, SiC, SiN, SiOC, SiON, SiCN, TiN, AlN, AlON, TEOS, hard black diamond (HBD), or the like. Alternatively, the lower ESL 120 may be formed by depositing and annealing a metal oxide material, which includes hafnium (Hf), hafnium oxide ($HfO_2$), or aluminum (Al). In some embodiments, the lower ESL 120 has a thickness in a range from about 10 Å to about 300 Å.

As depicted in FIG. 3, the method 200 may further comprise forming a hard mask layer 140 over the first LK dielectric layer 130. In some embodiments, the hard mask layer 140 includes a dielectric material, such as silicon oxide, silicon nitride, silicon oxynitride, or other suitable materials. In some embodiments, the hard mask layer 140 includes a metal nitride compound, such as TiN. The hard mask layer 140 may be deposited using an ALD, CVD, or PVD process.

Figure 4:
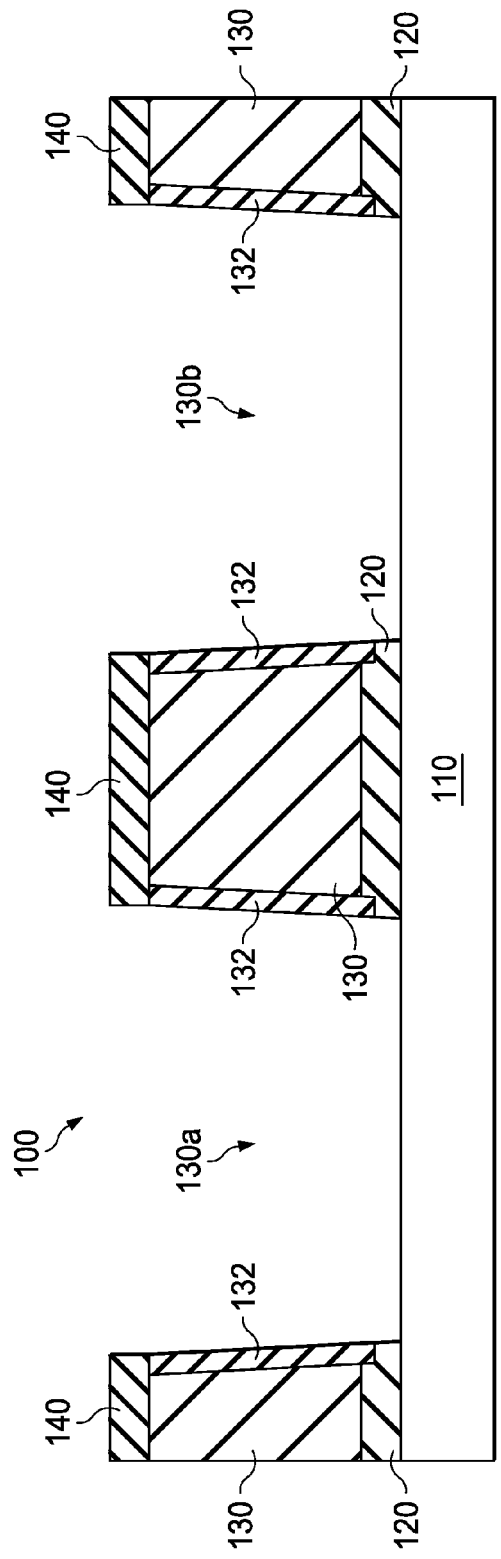
Figure 5:
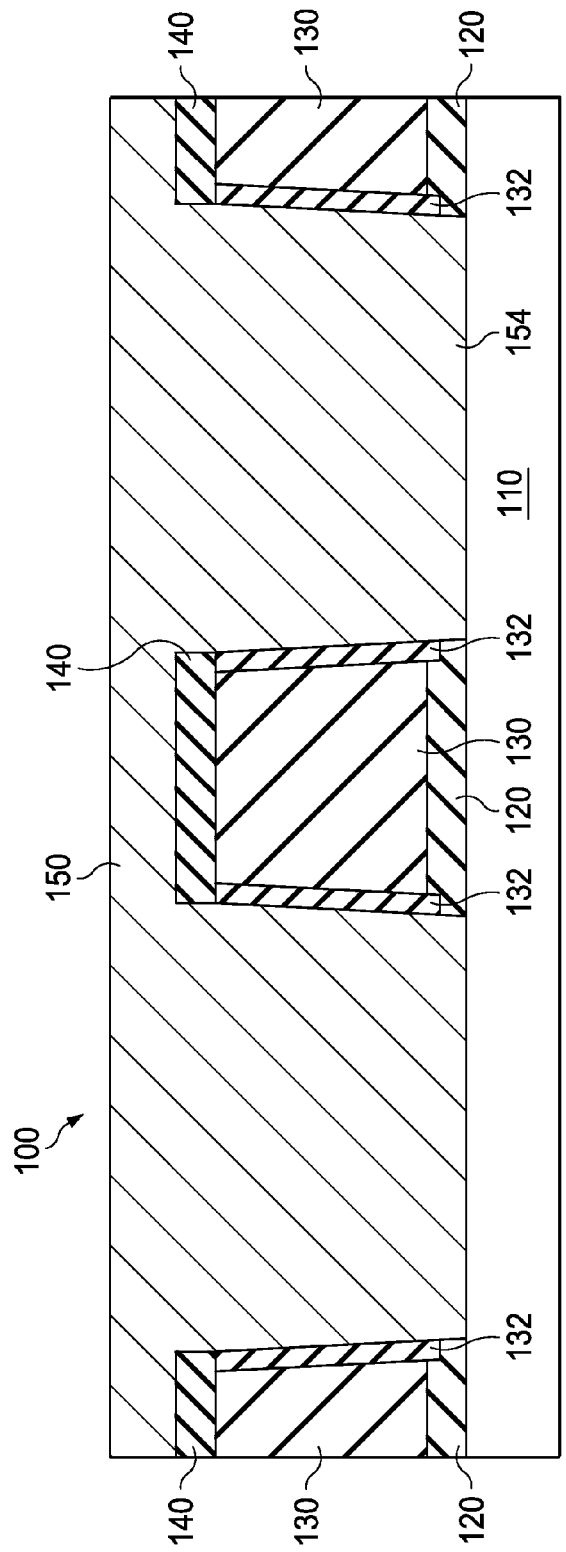
Figure 6:
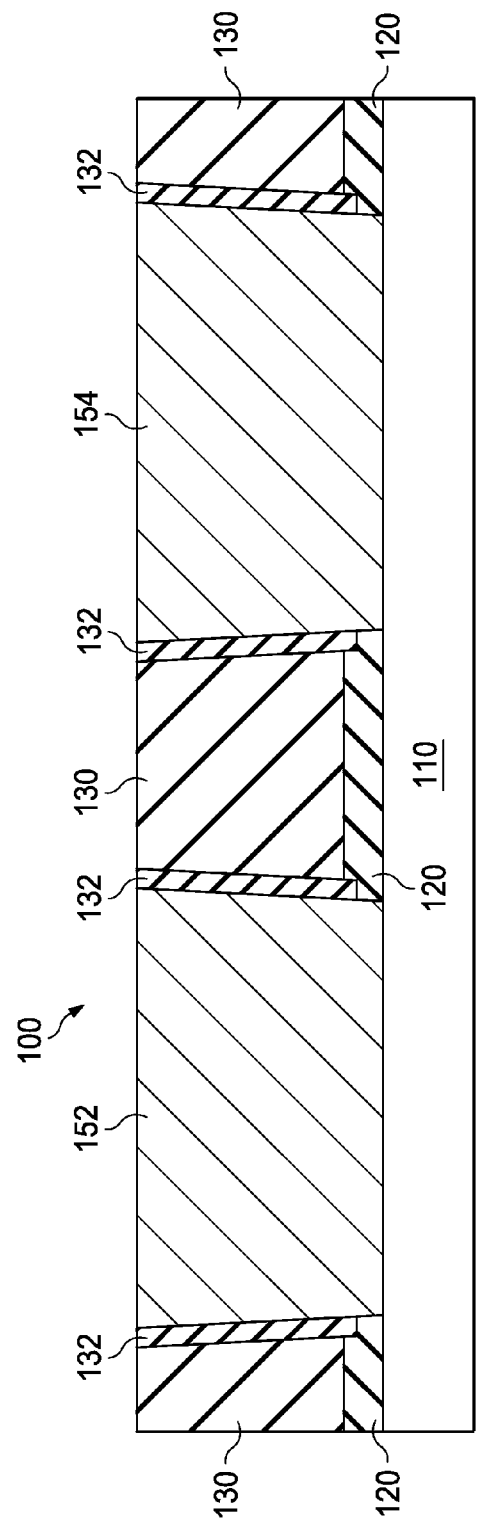

As depicted in FIGS. 4-6 and step 220 in FIG. 2, the method 200 continues with step 220 by forming a first metal line 152 and a second metal line 154 in the first LK dielectric layer 130. In some embodiments, the step of forming a first metal line 152 and a second metal line 154 in the first LK dielectric layer 130 comprises forming a first opening 130a and a second opening 130b in the first LK dielectric layer 130; forming a metal layer 150 in the first opening 130a and the second opening 130b; and performing chemical-mechanical planarization (CMP) on at least one of the first LK dielectric layer 130 or the metal layer 150.

As depicted in FIG. 4, the first opening 130a and the second opening 130b are formed by a photolithography process (e.g., patterning the hard mask layer 140 first) followed by a dry etching process containing plasma. The first opening 130 or the second opening 130b may include a trench and/or a via plug hole through the lower ESL 120. The dry etching process may be a single step or a multiple step etching process. The dry etching process may be an anisotropic etching process. The dry etching process may use reactive ion etch (RIE) and/or other suitable process. In one example, the dry etching process is used to etch the first LK dielectric layer 130 that includes a chemistry including fluorine-containing gas. A layer 132 of processed (e.g., plasma damaged) LK dielectric material is formed along a wall of the first opening 130a and the second opening 130b during the dry etching process. The processed LK dielectric material has a higher dielectric constant (k) than the non-processed LK dielectric material does. Too much processed LK dielectric material will make the k value of the first LK dielectric layer 130 unpredictable. In some embodiments, the layer 132 has a width in a range from about 1 Å to about 100 Å.

As depicted in FIG. 5, the metal layer 150 may be formed by a process including, but not limited to, ALD, PVD, CVD, sputtering, plating, or combinations thereof. The metal layer 150 comprises Cu, Al, Ag, Au, or alloys thereof. The metal layer 150 may also comprise one or more barrier layers selected from a group of W, WN, Ti, Al, TiAl, TiN, TiAlN, Ta, TaC, TaN, TaCN, TaSiN, Mn, Zr, Nb, or Ru. As depicted in FIG. 6, a planarization process, such as a CMP process, may be performed to planarize at least one of the first LK dielectric layer 130 or the metal layer 150.

Figure 7:
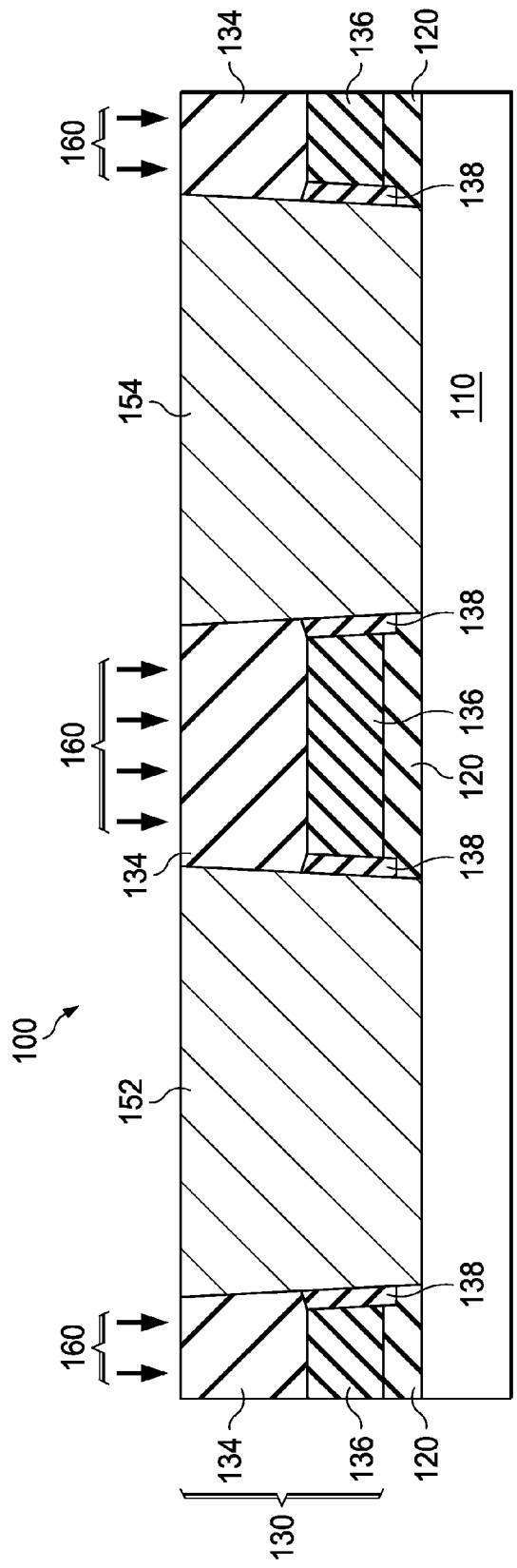

As depicted in FIG. 7 and step 230 in FIG. 2, the method 200 continues with step 230 by performing a vapor etching process 160 on a portion 134 of the first LK dielectric layer 130. The vapor etching process is to remove part of the layer 132 of processed LK dielectric material (including part of non-processed LK dielectric material) in the portion 134 of the first LK dielectric layer 130 and not to cause plasma damage on the first metal line 152, the second metal line 154, and the first LK dielectric layer 130. In some embodiments, the vapor etching process is performed at about 30 degrees Celsius (° C.) to about 80 degrees Celsius (° C.). In some embodiments, the vapor etching process is performed at about 40° C. to about 70° C. In some embodiments, the vapor etching process 160 uses a mixture of a fluorine-containing gas and a nitrogen-containing gas to react with the portion 134 of the first LK dielectric layer 130. For example, the fluorine-containing gas may comprise hydrogen fluoride (HF), or other suitable gases. For example, the nitrogen-containing gas may comprise ammonia ($NH_3$), or other suitable gases. In some embodiments, the mixture further comprises a carrier gas. For example, the carrier gas may comprise helium (He), neon (Ne), argon (Ar), nitrogen ($N_2$), carbon dioxide ($CO_2$), or a combination thereof. In some embodiments, a volume percentage of the fluorine-containing gas in the mixture is about 10% to about 60%. A volume percentage of the nitrogen-containing gas in the mixture is about 10% to about 60%. A volume percentage of the carrier gas in the mixture is about 5% to about 80%. During the vapor etching process 160, the mixture of the fluorine-containing gas and the nitrogen-containing gas will react with the dielectric material of the portion 134 (including part of the layer 132 of processed LK dielectric material) to form a residue "ammonium fluosilicate" (($NH_4)_2SiF_6$).

Figure 8:
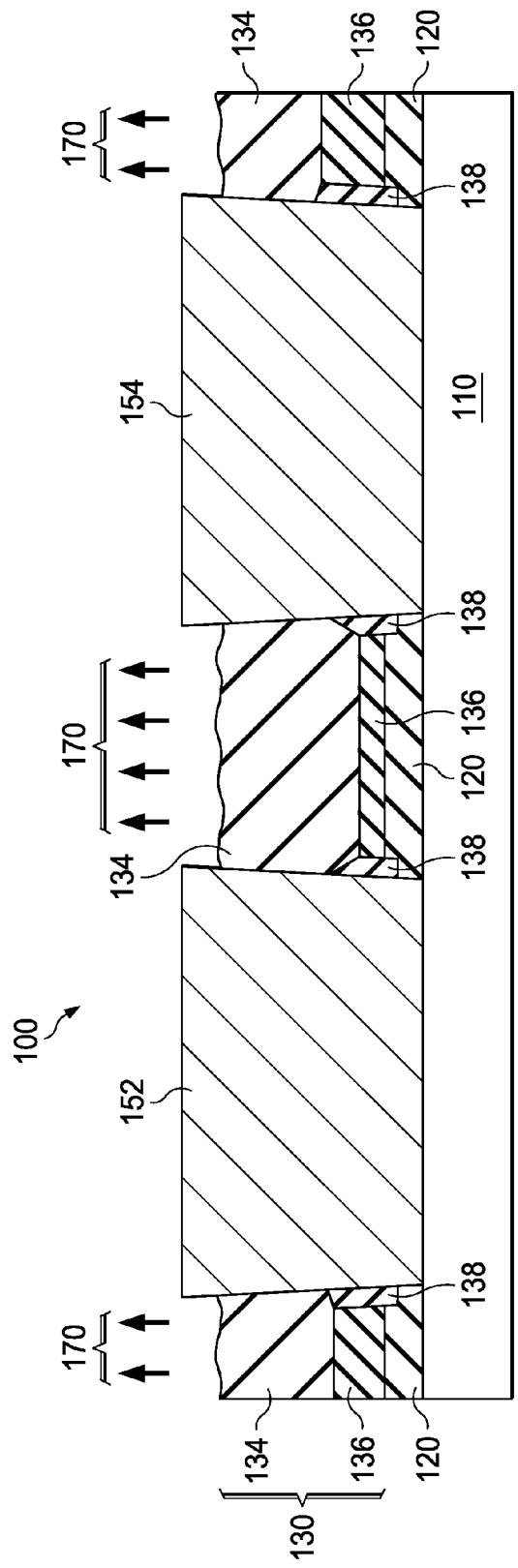
Figure 9:
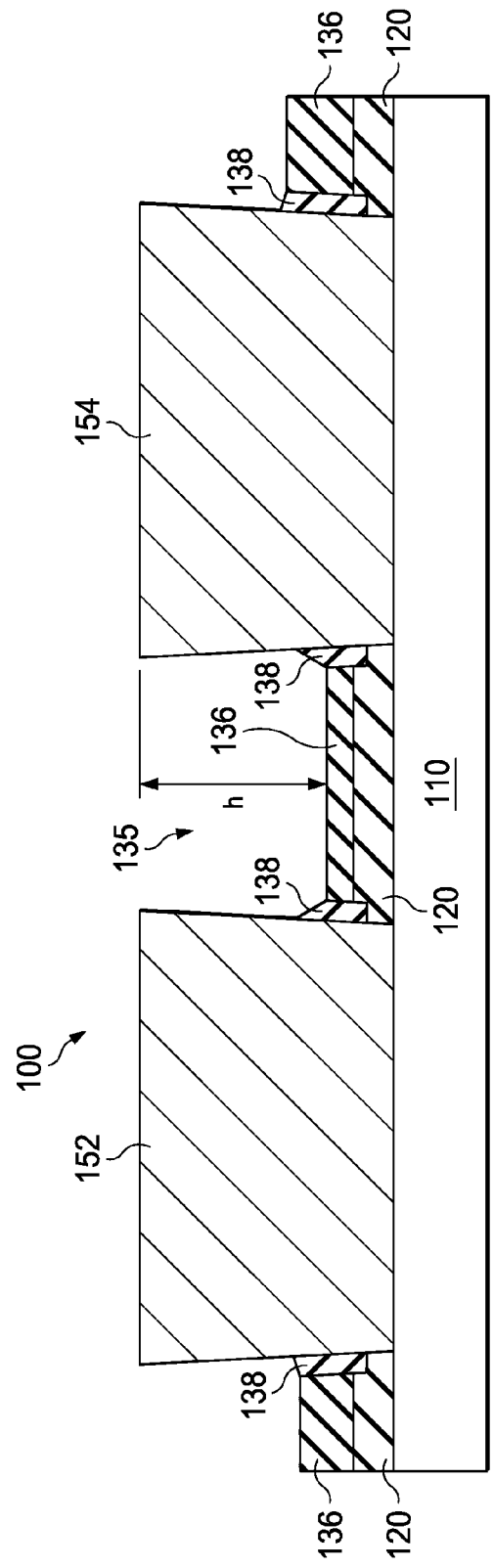

As depicted in FIGS. 8 and 9, and step 240 in FIG. 2, the method 200 continues with step 240 by removing the portion 134 of the first LK dielectric layer 130 while leaving a remained portion 136 of the first LK dielectric layer 130, to form a recess 135 by a heat treatment. In some embodiments, the heat treatment is performed at about 100° C. to about 400° C. In some embodiments, the heat treatment is performed at about 240° C. to about 350° C. Above 100° C., $(NH_4)_2SiF_6$ decomposition 170 may take place as equation (1):

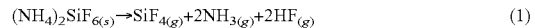  (1)

or equation (2) and equation (3) above 240° C.:

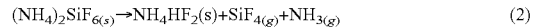  (2)

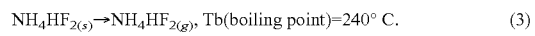  (3)

Thus, $(NH_4)_2SiF_6$ is decomposed into at least one of ammonium bifluoride ($NH_4HF_2$), silicon tetrafluoride ($SiF_4$), ammonia ($NH_3$), or hydrogen fluoride (HF) by the heat treatment, and then the above product gases will be pumped out. After the decomposition 170, the recess 135 is formed over the remained portion 136 of the first LK dielectric layer 130 (including a remained layer 138 of processed LK dielectric material). In some embodiments, the recess 135 has a height h in a range from about 1 nm to about 50 nm.

Figure 10:
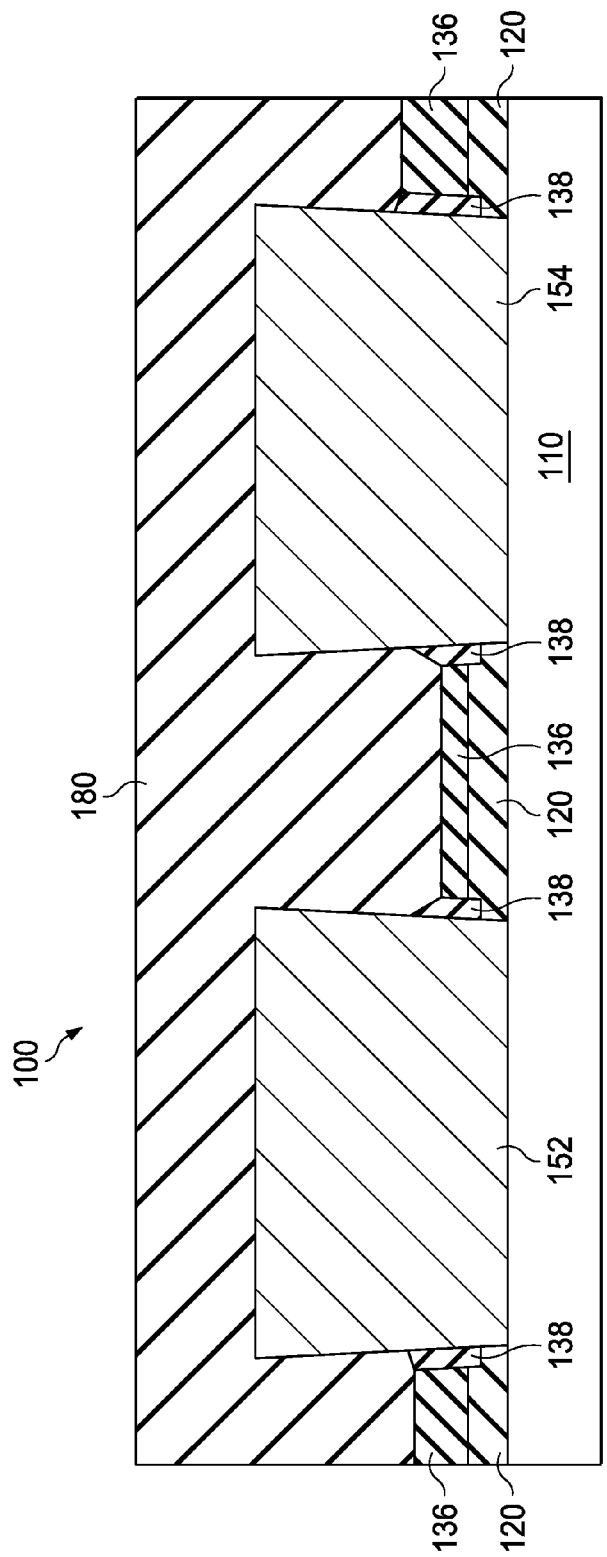
Figure 11:
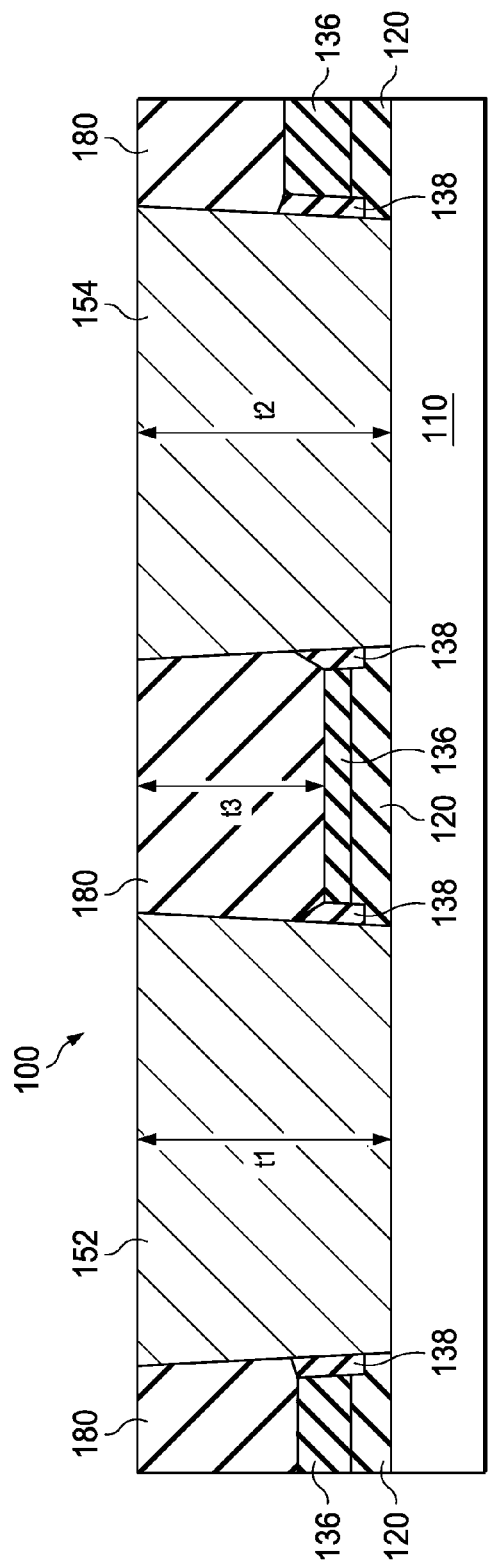

As depicted in FIGS. 10 and 11, and step 250 in FIG. 2, the method 200 continues with step 250 by forming a second LK dielectric layer 180 in the recess 135. The second LK dielectric layer 180 may be formed by ALD, CVD, PVD, or combinations thereof. In some embodiments, the step of forming a second LK dielectric layer 180 in the recess 135 comprises forming the second LK dielectric layer 180 over the remained portion 136 of the first LK dielectric layer 130, the first metal line 152, and the second metal line 154 as shown in FIG. 10; and performing chemical-mechanical planarization (CMP) on at least one of the second LK dielectric layer 180, the first metal line 152, or the second metal line 154 as shown in FIG. 11. A top surface of the second LK dielectric layer 180 is substantially coplanar with a top surface of the first metal line 152 or the second metal line 154, and a thickness t3 of the second LK dielectric layer 180 is less than a thickness t1 of the first metal line 152 or a thickness t2 of the second metal line 154. In some embodiments, the thickness t3 of the second LK dielectric layer 180 is about 1 nm to about 50 nm. A dielectric material of the second LK dielectric layer 180 comprises an oxide, SiO2, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. In some embodiments, the k value of the second LK dielectric layer 180 is less than or substantially equal to that of the remained portion 136 of the first LK dielectric layer 130.

As depicted in FIG. 1, the method 200 may further comprise forming an upper etch stop layer (ESL) 190 over the second LK dielectric layer 180, the first metal line 152, and the second metal line 154. The upper ESL 190 may be formed using a suitable process such as ALD, CVD, PVD, MBE, spin-on, or combinations thereof. The material for the upper ESL 190 includes SiO, SiC, SiN, SiOC, SiON, SiCN, TiN, AlN, AlON, TEOS, hard black diamond (HBD), or the like. Alternatively, the upper ESL 190 may be formed by depositing and annealing a metal oxide material, which includes hafnium (Hf), hafnium oxide ($HfO_2$), or aluminum (Al). In some embodiments, the upper ESL 190 has a thickness in a range from about 10 Å to about 300 Å.

Figure 12:
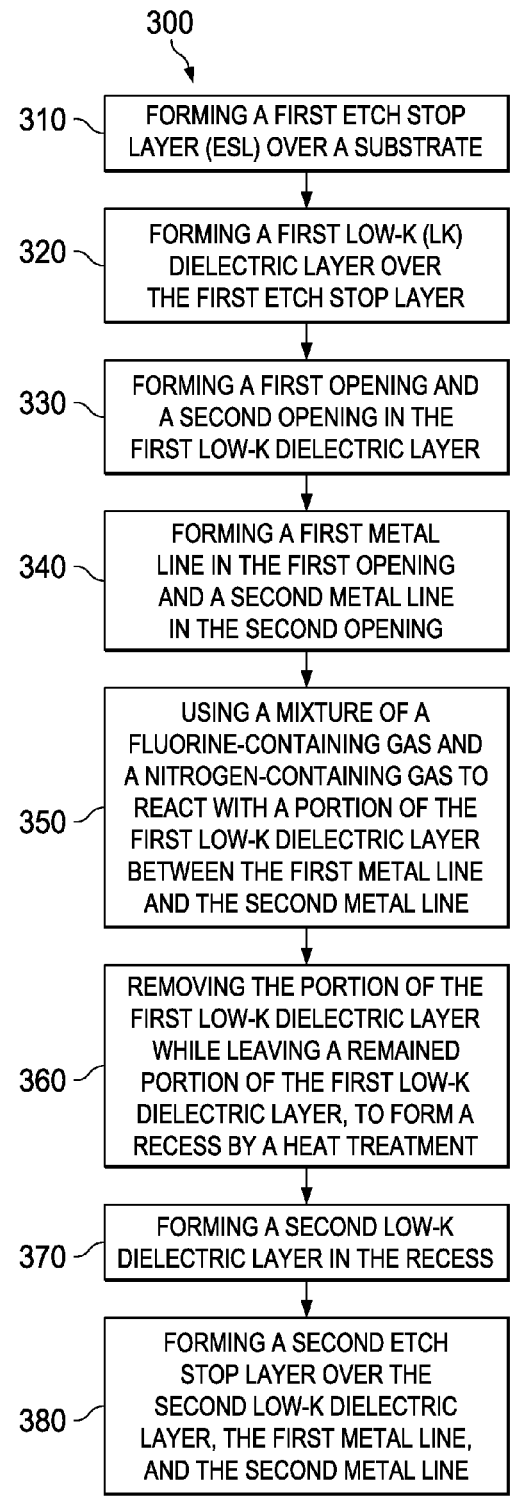
FIG. 12 is a flowchart of a method 300 of forming an interconnect structure 100 according to various aspects of the present disclosure.

FIG. 12 is a flowchart of a method 300 of forming an interconnect structure 100 according to various aspects of the present disclosure. It is understood that additional steps can be provided before, during, and after the method 300, and some of the steps described can be replaced or eliminated for other embodiments of the method 300. The method 300 begins at step 310 in which a first etch stop layer (ESL) is formed over a substrate. The method 300 continues with step 320 in which a first low-k (LK) dielectric layer is formed over the first ESL. The method 300 continues with step 330 in which a first opening and a second opening are formed in the first LK dielectric layer. The method 300 continues with step 340 in which a first metal line is formed in the first opening and a second metal line is formed in the second opening. The method 300 continues with step 350 in which a mixture of a fluorine-containing gas and a nitrogen-containing gas is used to react with a portion of the first LK dielectric layer between the first metal line and the second metal line. The method 300 continues with step 360 in which the portion of the first LK dielectric layer is removed while a remained portion of the first LK dielectric layer is left to form a recess by a heat treatment. The method 300 continues with step 370 in which a second LK dielectric layer is formed in the recess. The method 300 continues with step 380 in which a second ESL is formed over the second LK dielectric layer, the first metal line, and the second metal line. The discussion that follows illustrates embodiments of the interconnect structure 100 that can be fabricated according to the method 300 of FIG. 12.

FIGS. 3-11 are cross-sectional views of the interconnect structure 100 at various stages of fabrication according to various aspects of the present disclosure. As depicted in FIG. 3 and step 310 in FIG. 12, the method 300 begins at step 310 by forming a first etch stop layer (ESL) 120 over a substrate 110. The method 200 continues with step 320 by forming a first low-k (LK) dielectric layer 130 over the first ESL 120. The method 200 may further comprise forming a hard mask layer 140 over the first LK dielectric layer 130.

As depicted in FIG. 4 and step 330 in FIG. 12, the method 300 continues with step 330 by forming a first opening 130*a* and a second opening 130*b* in the first LK dielectric layer 130. The first opening 130*a* and the second opening 130*b* are formed by a photolithography process (e.g., patterning the hard mask layer 140 first) followed by a dry etching process containing plasma. The first opening 130 or the second opening 130*b* may include a trench and/or a via plug hole through the first ESL 120. The dry etching process may be a single step or a multiple step etching process. The dry etching process may be an anisotropic etching process. The dry etching process may use reactive ion etch (RIE) and/or other suitable process. In one example, the dry etching process is used to etch the first LK dielectric layer 130 that includes a chemistry including fluorine-containing gas. A layer 132 of processed (e.g., plasma damaged) LK dielectric material is formed along a wall of the first opening 130*a* and the second opening 130*b* during the dry etching process. The processed LK dielectric material has a higher dielectric constant (k) than the non-processed LK dielectric material does. Too much processed LK dielectric material will make the k value of the first LK dielectric layer 130 unpredictable. In some embodiments, the layer 132 has a width in a range from about 1 Å to about 100 Å.

As depicted in FIGS. 5 and 6, and step 340 in FIG. 12, the method 300 continues with step 340 by forming a first metal line 152 in the first opening 130*a* and a second metal line 154 in the second opening 130*b*. In some embodiments, the step of forming a first metal line 152 in the first opening 130*a* and a second metal line 154 in the second opening 130*b* comprises forming a metal layer 150 in the first opening 130*a* and the second opening 130*b*; and performing chemical-mechanical planarization (CMP) on at least one of the first LK dielectric layer 130 or the metal layer 150.

As depicted in FIG. 7 and step 350 in FIG. 12, the method 300 continues with step 350 by using a mixture of a fluorine-containing gas and a nitrogen-containing gas to react with a portion 134 of the first LK dielectric layer 130 between the first metal line 152 and the second metal line 154. It is to remove part of the layer 132 of processed LK dielectric material (including part of non-processed LK dielectric material) in the portion 134 of the first LK dielectric layer 130 and not to cause plasma damage on the first metal line 152, the second metal line 154, and the first LK dielectric layer 130. In some embodiments, the reaction 160 is performed at about 30° C. to about 80° C. In some embodiments, the reaction 160 is performed at about 40° C. to about 70° C. During the reaction 160, a residue "ammonium fluosilicate" (($NH_4)_2SiF_6$) is formed.

As depicted in FIGS. 8 and 9, and step 360 in FIG. 12, the method 300 continues with step 360 by removing the portion 134 of the first LK dielectric layer 130 while leaving a remained portion 136 of the first LK dielectric layer 130, to form a recess 135 by a heat treatment. In some embodiments, the heat treatment is performed at about 100° C. to about 400° C. In some embodiments, the heat treatment is performed at about 240° C. to about 350° C. $(NH_4)_2SiF_6$ is decomposed into at least one of ammonium bifluoride ($NH_4HF_2$), silicon tetrafluoride ($SiF_4$), ammonia ($NH_3$), or hydrogen fluoride (HF) by the heat treatment, and then the above product gases will be pumped out. After decomposition 170, the recess 135 is formed over the remained portion 136 of the first LK dielectric layer 130 (including a remained layer 138 of processed LK dielectric material). In some embodiments, the recess 135 has a height h in a range from about 1 nm to about 50 nm.

As depicted in FIGS. 10 and 11, and step 370 in FIG. 12, the method 300 continues with step 370 by forming a second LK dielectric layer 180 in the recess 135. In some embodiments, the step of forming a second LK dielectric layer 180 in the recess 135 comprises forming the second LK dielectric layer 180 over the remained portion 136 of the first LK dielectric layer 130, the first metal line 152, and the second metal line 154 as shown in FIG. 10; and performing chemical-mechanical planarization (CMP) on at least one of the second LK dielectric layer 180, the first metal line 152, or the second metal line 154 as shown in FIG. 11. A top surface of the second LK dielectric layer 180 is substantially coplanar with a top surface of the first metal line 152 or the second metal line 154, and a thickness t3 of the second LK dielectric layer 180 is less than a thickness t1 of the first metal line 152 or a thickness t2 of the second metal line 154. In some embodiments, the thickness t3 of the second LK dielectric layer 180 is about 1 nm to about 50 nm. In some embodiments, the k value of the second LK dielectric layer 180 is less than or substantially equal to that of the remained portion 136 of the first LK dielectric layer 130.

As depicted in FIG. 1 and step 380 in FIG. 12, the method 300 continues with step 380 by forming a second ESL 190 over the second LK dielectric layer 180, the first metal line 152, and the second metal line 154.

The methods of the present disclosure are not limited to be used by a planar device on the substrate and can be applied to a non-planar device as well, such as a fin-like field effect transistor (FinFET) or a nanowire transistor. Based on the discussions above, it can be seen that by using the methods of the present disclosure, the dielectric constant (k) of the LK dielectric material is reduced. As mentioned above, a layer of processed (e.g., plasma-damaged) LK dielectric material is formed during the dry etching process. Since the processed LK dielectric material has a higher dielectric constant (k) than the non-processed LK dielectric material does, too much processed LK dielectric material will cause the k value of the first LK dielectric layer higher than an expected value (e.g., the expected value is about 1.5 to about 2.8). By removing part of the processed LK dielectric material (without further inducing plasma damage on the first LK dielectric layer) and forming the second LK dielectric layer in the recess over the first LK dielectric layer, the k value of the LK dielectric material is reduced. As a result, the RC performance of the device can be well controlled by using the methods of the present disclosure.

One of the broader forms of the present disclosure involves a method of forming an interconnect structure. The method comprises forming a first low-k (LK) dielectric layer over a substrate; forming a first metal line and a second metal line in the first LK dielectric layer; performing a vapor etching process on a portion of the first LK dielectric layer; removing the portion of the first LK dielectric layer while leaving a remained portion of the first LK dielectric layer, to form a recess by a heat treatment; and forming a second LK dielectric layer in the recess.

In some embodiments, the step of forming a first metal line and a second metal line in the first LK dielectric layer comprises forming a first opening and a second opening in the first LK dielectric layer; forming a metal layer in the first opening and the second opening; and performing chemical-mechanical planarization (CMP) on at least one of the first LK dielectric layer or the metal layer.

In some embodiments, the vapor etching process is performed at about 30° C. to about 80° C.

In some embodiments, the heat treatment is performed at about 100° C. to about 400° C.

In some embodiments, the vapor etching process uses a mixture of a fluorine-containing gas and a nitrogen-containing gas to react with the portion of the first LK dielectric layer.

In some embodiments, the fluorine-containing gas comprises hydrogen fluoride (HF).

In some embodiments, the nitrogen-containing gas comprises ammonia ($NH_3$).

In some embodiments, the mixture further comprises a carrier gas.

In some embodiments, the carrier gas comprises helium (He), neon (Ne), argon (Ar), nitrogen ($N_2$), carbon dioxide ($CO_2$), or a combination thereof.

In some embodiments, a volume percentage of the fluorine-containing gas in the mixture is about 10% to about 60%.

In some embodiments, a volume percentage of the nitrogen-containing gas in the mixture is about 10% to about 60%.

In some embodiments, a volume percentage of the carrier gas in the mixture is about 5% to about 80%.

In some embodiments, ammonium fluosilicate (($NH_4)_2SiF_6$) is formed during the vapor etching process.

In some embodiments, ammonium fluosilicate (($NH_4)_2SiF_6$) is decomposed into at least one of ammonium bifluoride ($NH_4HF_2$), silicon tetrafluoride ($SiF_4$), ammonia ($NH_3$), or hydrogen fluoride (HF) by the heat treatment.

In some embodiments, the step of forming a second LK dielectric layer in the recess comprises forming the second LK dielectric layer over the remained portion of the first LK dielectric layer, the first metal line, and the second metal line; and performing chemical-mechanical planarization (CMP) on at least one of the second LK dielectric layer, the first metal line, or the second metal line.

In some embodiments, the method further comprises forming a lower etch stop layer (ESL) over the substrate before the forming the first LK dielectric layer over the substrate.

In some embodiments, the method further comprises forming an upper etch stop layer (ESL) over the second LK dielectric layer, the first metal line, and the second metal line.

Another of the broader forms of the present disclosure involves a method of forming an interconnect structure. The method comprises forming a first etch stop layer (ESL) over a substrate; forming a first low-k (LK) dielectric layer over the first ESL; forming a first opening and a second opening in the first LK dielectric layer; forming a first metal line in the first opening and a second metal line in the second opening; using a mixture of a fluorine-containing gas and a nitrogen-containing gas to react with a portion of the first LK dielectric layer between the first metal line and the second metal line; removing the portion of the first LK dielectric layer while leaving a remained portion of the first LK dielectric layer, to form a recess by a heat treatment; forming a second LK dielectric layer in the recess; and forming a second ESL over the second LK dielectric layer, the first metal line, and the second metal line.

Still another of the broader forms of the present disclosure involves an interconnect structure. The interconnect structure comprises a first metal line and a second metal line over a substrate; a portion of a first low-k (LK) dielectric layer between the first metal line and the second metal line; and a second LK dielectric layer over the portion of the first LK dielectric layer, wherein a top surface of the second LK dielectric layer is substantially coplanar with a top surface of the first metal line or the second metal line, and wherein a thickness of the second LK dielectric layer is less than a thickness of the first metal line or a thickness of the second metal line.

In some embodiments, the thickness of the second LK dielectric layer is about 1 nm to about 50 nm.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an interconnect structure, comprising:
    forming a first low-k (LK) dielectric layer over a substrate;
    forming a first metal line and a second metal line in the first LK dielectric layer;
    performing a vapor etching process on a portion of the first LK dielectric layer;
    removing the portion of the first LK dielectric layer while leaving a remained portion of the first LK dielectric layer, to form a recess by a heat treatment;
    forming a second LK dielectric layer in the recess, the dielectric constant of the second LK dielectric layer being less than or substantially equal to that of the first LK dielectric layer; and
    forming a third dielectric layer on a coplanar upper surface formed by the second LK dielectric layer, the first metal line and the second metal line, wherein the second LK dielectric layer completely covers the first LK dielectric layer such that the first LK dielectric layer is not exposed.

2. The method of claim 1, wherein the step of forming a first metal line and a second metal line in the first LK dielectric layer comprises:
    forming a first opening and a second opening in the first LK dielectric layer;
    forming a metal layer in the first opening and the second opening; and
    performing chemical-mechanical planarization (CMP) on at least one of the first LK dielectric layer or the metal layer.

3. The method of claim 1, wherein the vapor etching process is performed at about 30° C. to about 80° C.

4. The method of claim 1, wherein the heat treatment is performed at about 100° C. to about 400° C.

5. The method of claim 1, wherein the vapor etching process uses a mixture of a fluorine-containing gas and a nitrogen-containing gas to react with the portion of the first LK dielectric layer.

6. The method of claim 5, wherein the fluorine-containing gas comprises hydrogen fluoride (HF).

7. The method of claim 5, wherein the nitrogen-containing gas comprises ammonia (NH3).

8. The method of claim 5, wherein the mixture further comprises a carrier gas.

9. The method of claim 8, wherein the carrier gas comprises helium (He), neon (Ne), argon (Ar), nitrogen (N2), carbon dioxide (CO2), or a combination thereof.

10. The method of claim 8, wherein a volume percentage of the fluorine-containing gas in the mixture is about 10% to about 60%.

11. The method of claim 8, wherein a volume percentage of the nitrogen-containing gas in the mixture is about 10% to about 60%.

12. The method of claim 8, wherein a volume percentage of the carrier gas in the mixture is about 5% to about 80%.

13. The method of claim 5, wherein ammonium fluosilicate ((NH4)2SiF6) is formed during the vapor etching process.

14. The method of claim 13, wherein ammonium fluosilicate ((NH4)2SiF6) is decomposed into at least one of ammonium bifluoride (NH4HF2), silicon tetrafluoride (SiF4), ammonia (NH3), or hydrogen fluoride (HF) by the heat treatment.

15. The method of claim 1, wherein the step of forming a second LK dielectric layer in the recess comprises:
    forming the second LK dielectric layer over the remained portion of the first LK dielectric layer, the first metal line, and the second metal line; and
    performing chemical-mechanical planarization (CMP) on at least one of the second LK dielectric layer, the first metal line, or the second metal line.

16. The method of claim 1, further comprising forming a lower etch stop layer (ESL) over the substrate before the forming the first LK dielectric layer over the substrate.

17. The method of claim 1, further comprising forming an upper etch stop layer (ESL) over the second LK dielectric layer, the first metal line, and the second metal line.

18. A method of forming an interconnect structure, comprising:
    forming a first etch stop layer (ESL) over a substrate;
    forming a first low-k (LK) dielectric layer over the first ESL;
    forming a first opening and a second opening in the first LK dielectric layer;
    forming a first metal line in the first opening and a second metal line in the second opening;
    using a mixture of a fluorine-containing gas and a nitrogen-containing gas to react with a portion of the first LK dielectric layer between the first metal line and the second metal line;
    removing the portion of the first LK dielectric layer while leaving a remained portion of the first LK dielectric layer, to form a recess by a heat treatment;
    completely filling the recess to form a second LK dielectric layer in the recess, the dielectric constant of the second LK dielectric layer being less than or substantially equal to that of the first LK dielectric layer; and
    forming a second ESL over a coplanar surface formed by the second LK dielectric layer, the first metal line and the second metal line, the second LK dielectric layer overlying the first LK dielectric layer such that no first LK dielectric layer is exposed.

19. A method of forming an interconnect structure, comprising:
    forming a first low-k (LK) dielectric layer over a substrate;
    patterning the first LK dielectric layer to form a first opening and a second opening;
    simultaneously filling the first opening and the second opening with a conductor;
    planarizing the conductor to have a top surface substantially co-planar with a top surface of the patterned first LK dielectric layer to form a first metal feature and a second metal feature;
    modifying a portion of the first LK dielectric layer using a vapor etch process;
    applying a heat treatment to the modified portion of the first LK dielectric layer to remove the modified portion of the first LK dielectric layer, while leaving a remaining portion of the first LK dielectric layer interjacent the first metal feature and the second metal feature;
    depositing a second LK dielectric layer over the remaining portion of the first LK dielectric layer, the dielectric constant of the second LK dielectric layer being less than or substantially equal to that of the first LK dielectric layer, the second LK dielectric layer extending from the first metal feature to the second metal feature and contacting a sidewall of the first and the second metal feature;
    planarizing the second LK dielectric layer to have a top surface substantially co-planar with the top surface of the first metal feature and the second metal feature; and forming a third dielectric layer over the co-planar top surfaces of the second LK dielectric layer, the first metal feature and the second metal feature, the second LK dielectric layer completely covering the first LK dielectric layer without leaving the first LK dielectric layer exposed.

20. The method of claim 19, wherein the step of patterning the first LK dielectric layer forms a layer of processed first LK dielectric material along sidewalls of the first opening and second opening.

* * * * *